United States Patent
Kittl et al.

(10) Patent No.: US 10,205,025 B2
(45) Date of Patent: Feb. 12, 2019

(54) METHODS TO ACHIEVE STRAINED CHANNEL FINFET DEVICES

(71) Applicant: Samsung Electronics Co., Ltd., Suwon-si, Gyeonggi-do (KR)

(72) Inventors: Jorge A. Kittl, Round Rock, TX (US); Joon Goo Hong, Austin, TX (US); Dharmendar Reddy Palle, Austin, TX (US); Mark S. Rodder, Dallas, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/276,779

(22) Filed: Sep. 26, 2016

(65) Prior Publication Data

US 2017/0263748 A1  Sep. 14, 2017

Related U.S. Application Data

(60) Provisional application No. 62/307,372, filed on Mar. 11, 2016.

(51) Int. Cl.
*H01L 29/78* (2006.01)
*H01L 29/417* (2006.01)
*H01L 29/66* (2006.01)

(52) U.S. Cl.
CPC ...... *H01L 29/785* (2013.01); *H01L 29/41791* (2013.01); *H01L 29/66545* (2013.01); *H01L 29/66553* (2013.01); *H01L 29/66795* (2013.01); *H01L 29/7849* (2013.01)

(58) Field of Classification Search
CPC .................................... H01L 29/785
USPC ................. 257/401, 347; 438/283
See application file for complete search history.

(56) References Cited

U.S. PATENT DOCUMENTS

| | | | |
|---|---|---|---|
| 9,070,770 B2 | 6/2015 | Basu et al. | |
| 9,184,294 B2 | 11/2015 | Cea et al. | |
| 2004/0150029 A1* | 8/2004 | Lee | H01L 29/41791 257/308 |
| 2009/0065853 A1* | 3/2009 | Hanafi | H01L 29/1054 257/327 |
| 2013/0228862 A1* | 9/2013 | Lee | H01L 21/823807 257/347 |
| 2013/0248948 A1* | 9/2013 | Ma | H01L 29/66636 257/288 |
| 2014/0134831 A1* | 5/2014 | Chao | H01L 29/66795 438/478 |
| 2014/0217517 A1* | 8/2014 | Cai | H01L 27/0886 257/401 |

(Continued)

*Primary Examiner* — Igwe U Anya
(74) *Attorney, Agent, or Firm* — Renaissance IP Law Group LLP

(57) ABSTRACT

Methods to achieve strained channel finFET devices and resulting finFET devices are presented. In an embodiment, a method for processing a field effect transistor (FET) device may include forming a fin structure comprising a fin channel on a substrate. The method may also include forming a sacrificial epitaxial layer on a side of the fin structure. Additionally, the method may include forming a deep recess in a region that includes at least a portion of the fin structure, wherein the fin structure and sacrificial layer relax to form a strain on the fin channel. The method may also include depositing source/drain (SD) material in the deep recess to preserve the strain on the fin channel.

19 Claims, 23 Drawing Sheets

(56) References Cited

U.S. PATENT DOCUMENTS

| | | | |
|---|---|---|---|
| 2015/0041908 A1* | 2/2015 | Adam | H01L 21/823821 257/369 |
| 2015/0084101 A1* | 3/2015 | Adam | H01L 29/6681 257/288 |
| 2015/0115334 A1* | 4/2015 | Liaw | H01L 29/7849 257/288 |
| 2015/0214051 A1* | 7/2015 | Kim | H01L 21/02636 257/192 |
| 2015/0364603 A1 | 12/2015 | Cheng et al. | |
| 2016/0079248 A1* | 3/2016 | Basker | H01L 29/0692 257/347 |
| 2016/0181395 A1* | 6/2016 | Liu | H01L 29/66545 257/347 |

* cited by examiner

METHODS TO ACHIEVE STRAINED CHANNEL FINFET DEVICES

RELATED APPLICATION DATA

This application claims the benefit of U.S. Patent Application Ser. No. 62/307,372, filed Mar. 11, 2016, which is hereby incorporated by reference.

FIELD

This disclosure relates generally to semiconductor device manufacturing, and more specifically, to methods to achieve strained channel fin-type field effect transistor (finFET) devices.

BACKGROUND

One basic component of a semiconductor device is a transistor, commonly referred to as a FET. Various types of FET devices exist, and the function, composition, and use of FET devices varies. One type of FET device commonly used in semiconductor devices is a metal-oxide-semiconductor field effect transistor (MOSFET). MOSFET devices generally come in two distinct types, positive MOSFET (pMOS) devices, and negative MOSFET (nMOS) devices. Digital data processing devices may include a combination of pMOS and nMOS devices, which are arranged in a complimentary metal-oxide-semiconductor (CMOS) arrangement. Transistor size constraints in advanced semiconductor devices have required more compact transistor designs and topologies. One such design includes a fin-shaped FET (finFET). FinFETs may include multi-gate structures combined to provide scalable CMOS circuits for digital applications.

During processes of fabricating channel structures in the fins, strain can be introduced in the channel. The strain may be a physical or mechanical result of the materials used in fabricating the structure. Also, varying strain may be caused by variations in physical dimensions of the channel structures. Variations in strain parameters may affect performance of the device. The effects may be adverse, or may enhance the performance of the device, depending upon the device configuration and the value of the strain parameter. Some examples of channel layers or channel structure include horizontal nano-sheets (hNS) and horizontal nano-wires (hNW).

Source/Drain (SD) stressors used in prior fabrication processes become less efficient with scaling, due to smaller SD volume. Also, SD stressors are not easy to implement to achieve tensile stressed channels in nMOS devices. Processing flows with built in stressed layers as starting material, such as those using strained silicon on insulator (sSOI), etc., and processing flows using underlayer stressors like strain relaxed buffer (SRB), face serious difficulties in maintaining the stress through the fabrication flow, typically losing most of the initial stress. In particular, stress is lost during deep SD recess and/or fin cut, due to elastic relaxation. Unfortunately, the strain is not adequately recovered during SD epitaxial regrowth, and as a consequence, the resulting devices have little or no strain in the channel. A way around this problem for these flows is to eliminate the deep SD recess and use clad epitaxial material in the SD (i.e. add epitaxial layer on top of the fin structure on the SD, without previously performing a SD recess), however, this may result in non-optimal doping profiles.

SUMMARY

Methods to achieve strained channel finFET devices and resulting finFET devices are presented. In an embodiment, a method for processing a field effect transistor (FET) device may include forming a fin structure comprising a fin channel on a substrate. The method may also include forming a sacrificial epitaxial layer on a side of the fin structure. Additionally, the method may include forming a deep recess in a region that includes at least a portion of the fin structure, wherein the fin structure and sacrificial layer relax to form a strain on the fin channel. The method may also include depositing source/drain (SD) material in the deep recess to preserve the strain on the fin channel.

A finFET device may include substrate, a fin structure comprising a fin channel disposed on the substrate, a sacrificial epitaxial layer disposed on a side of the fin structure, a deep recess in a region that includes at least a portion of the fin structure, wherein the fin structure and sacrificial layer relax to form a strain on the fin channel, and a source/drain (SD) layer deposited in the deep recess to preserve the strain on the fin channel.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
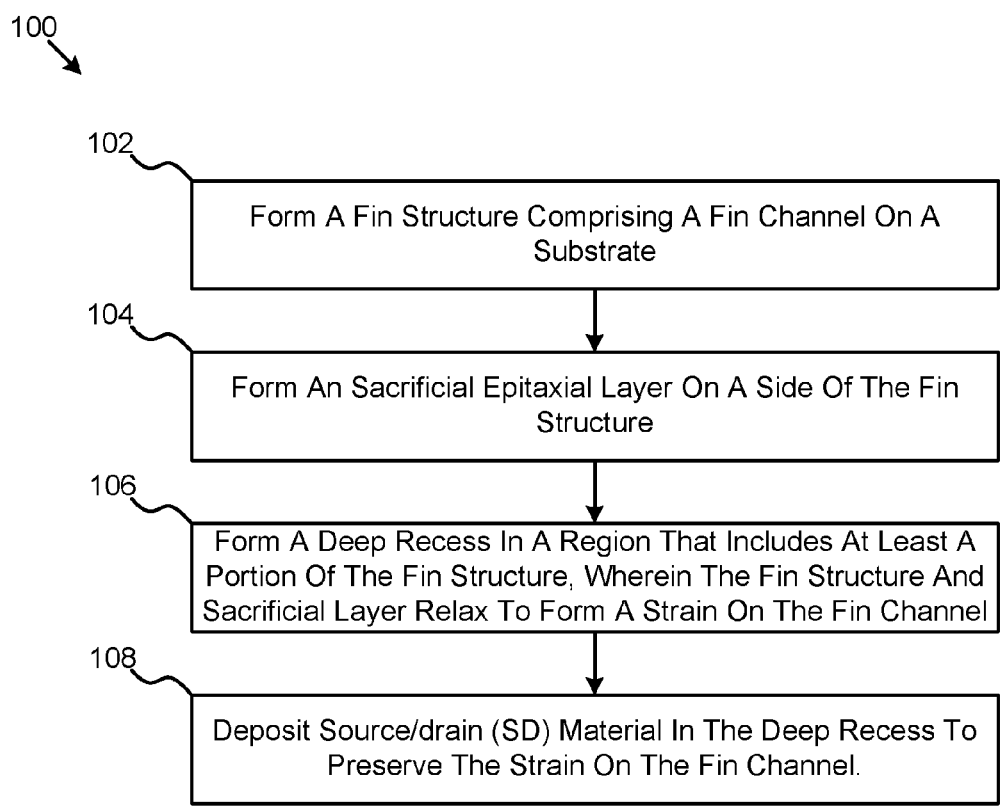
FIG. 1 is a flowchart diagram illustrating one embodiment of a method for forming a semiconductor device.

Embodiments of methods and systems to achieve strained channel finFET devices are described. In an embodiment, the method may fabricate strained channel finFET devices based on the use of sacrificial epitaxial layers grown on the sides of the fin, which are later removed. The flow starts with fin formation, with formation of fin structures in which the fin structures are substantially single crystal structures. An epitaxial growth of sacrificial layers, which may be in the range of about 2 nm to 15 nm, on sides of the fins is performed. The epitaxial grown may be performed after fin formation and before dummy gate formation, in some embodiments.

In some embodiments, during epitaxial growth of the sacrificial layers on sides of the fins, the layers grow with the same lattice parameter as present in the fins before this epitaxial growth step. For most practical implementations in scaled technologies, fin pitch may be quite small, less than 30 nm for example, and therefore, the sacrificial layers on adjacent fins may merge. The epitaxial growth of the sacrificial layers may be tuned to emphasize or de-emphasize faceting. Faceting during epitaxial growth may also depend on the specific crystal planes of the fin sidewalls, which may be different for different embodiments. In some embodiments, faceting during sacrificial layer epitaxial growth may result is a cavity or defect left under the merged sacrificial layers. If internal spacers are implemented, this cavity is later filled during internal spacer deposition.

After dummy gate formation, deep SD recesses may be formed. In an embodiment the distance between adjacent SDs along a fin may be 200 nm or less. During the deep SD recess etch, the structure comprising a fin and sacrificial layers, in between SD recesses, relaxes elastically, thereby achieving strain along the fin in the fin channel. In embodiments where the distances between adjacent SD recesses are about 200 nm or less ensures that this elastic relaxation takes place during SD recess.

In order to achieve tensile strained fin channels, the sacrificial stressor is chosen from materials that can grow epitaxially on the fin structure and that have larger lattice parameter than the lattice parameter of the fin material. In order to achieve compressive strained fin channels, the sacrificial stressor is chosen from materials that can grow epitaxially on the fin structure and that have smaller lattice parameter than the lattice parameter of the fin material. In one embodiment, internal spacers are formed after deep SD recess. The internal spacers are formed by recessing the sacrificial layers on the sides of the fin from the SD opening selectively to the fin channel material. In an embodiment, the recess is between 1 nm to 6 nm (depth in direction parallel to Fin). The exact depth of the recess may depend on the gate length and other dimensions, as well as other optimization considerations, but in a way that some substantial amount of sacrificial material is left (e.g. >5 nm of sacrificial material left, thickness measured in the direction parallel to the Fin)). Spacers may then be formed by deposition, followed by an anisotropic etch.

In implementations in which a cavity is left under the sacrificial layer during sacrificial layer epitaxial growth, the cavity remaining under the sacrificial layers in between SD regions may be filled with internal spacer material during internal spacer deposition (in some embodiments, the cavity may be completely filled by spacer material; in other embodiments, the cavity may be partially filled by spacer material, the spacer material isolating or separating the remainder of the cavity from the SD regions).

Additionally, a relaxed SD may be epitaxially regrown, allowing defect formation in the epitaxially regrown SD material, so that strain in the channel is preserved, using methods known to those of skill in the art. It is very challenging to achieve a SD regrowth that significantly changes the stress state of the channel, but it is quite easy to regrow the SDs in a way that does not change the strain in the channel from the state before SD regrowth. In some embodiments, the SD is filled or regrown with non-epitaxial material, also without changing significantly the strain state in the channel. The refilled and/or regrown SDs may act as pinning structures to hold a portion of the strain in the channel at the sacrificial layer removal step.

After removal of the dummy gate stack, the sacrificial layers on sides of the fins may be removed selectively to the fin channel material. Some of the channel strain may be lost during sacrificial layer removal, due to elastic relaxation of the structure; however, a significant portion of the strain remains after sacrificial layer selective removal, because the SDs hold the structures substantially in place. In some embodiments strain loss in the channel during sacrificial layer etch may less than ten percent. In some embodiments strain loss in the channel during sacrificial layer etch may be less than twenty percent. In some embodiments strain loss in the channel during sacrificial layer etch may be less than fifty percent. The remaining steps of the fabrication flow may follow conventional fin fabrication flows.

In some embodiments, SD regrowth that grows coherently with the fin crystal may change the strain state of the channel during growth, which may be advantageous. An example is for p-channel metal-oxide-silicon (pMOS) fins, where silicon-germanium (SiGe) with a mid to high-Ge content for SD material may add additional compressive strain to the channel. Such embodiments may be used to further boost strain in the channel.

In some embodiments, the fin material is Si and the sacrificial epitaxial layer material is a Si—Ge alloy. This results in tensile strain in the channel of the finished devices and can be used for nMOS. In some embodiments, the fin material is a Si—Ge alloy and the sacrificial epitaxial layer material is Si. This results in compressive strain in the channel of the finished devices and can be used for pMOS. In some embodiments, the fin material is a Si—Ge alloy and the sacrificial epitaxial layer material is a Si—Ge alloy of smaller Ge content than the fin material. This results in compressive strain in the channel of the finished devices and can be used for pMOS. In some embodiments, the fin material is Ge and the sacrificial epitaxial layer material is a Si—Ge alloy. This results in compressive strain in the channel of the finished devices and can be used for pMOS. Many other possible combinations may be implemented.

Advantageously, addition of the sacrificial epitaxial layer during the finFET formation process may add predictable amounts of strain to the fin channel of the finished devices. The present embodiments provide methods for creating tensile strain as well as compressive strain, depending upon the materials used.

Specifically, the substrate may be, for example, a bulk silicon substrate or a silicon-on-insulator (SOI) substrate. Otherwise, the substrate may be a silicon substrate or may be a substrate formed of another material such as silicon germanium, indium antimonide, lead telluride, indium arsenide, indium phosphide, gallium arsenide, or gallium antimonide. In some embodiments the substrate is a semiconductor on insulator substrate, the semiconductor may be silicon or another material such as silicon germanium, indium antimonide, lead telluride, indium arsenide, indium phosphide, gallium arsenide, or gallium antimonide.

FIG. 1 is a flowchart diagram illustrating one embodiment of a method 100 for forming a semiconductor device. In an embodiment, the method 100 may include forming a fin structure comprising a fin channel on a substrate, as shown at block 102. The method 100 may also include forming a sacrificial epitaxial layer on a side of the fin structure, as shown at block 104. Additionally, the method 100 may include forming a deep recess in a region that includes at least a portion of the fin structure, wherein the fin structure and sacrificial layer relax to form a strain on the fin channel, as shown at block 106. The method may also include depositing source/drain (SD) material in the deep recess to preserve the strain on the fin channel, as shown at block 108. Additional embodiments of a method, which may include various additional steps, are described below with reference to the process flow diagrams of FIGS. 2-17B.

Figure 2:
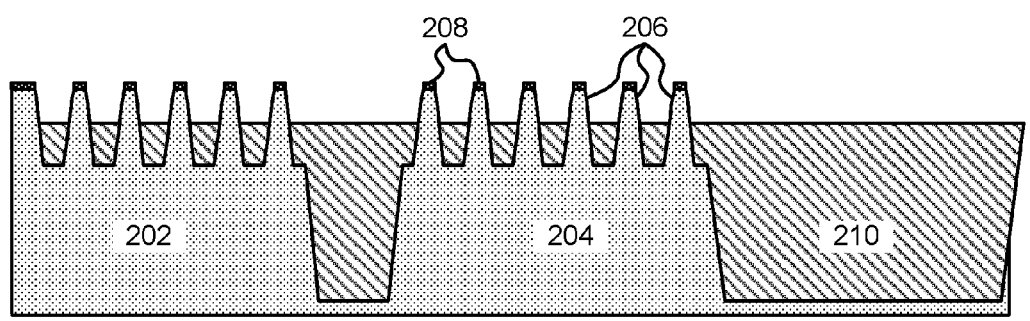
FIG. 2 is a cross-sectional view illustrating one embodiment of a semiconductor device at a processing flow step.

FIG. 2 is a cross-sectional view illustrating one embodiment of a semiconductor device at a processing flow step. In such an embodiment, a substrate 200 may include an nMOS region 202 and a nMOS region 204. Specifically, the substrate 200 may be, for example, a bulk silicon substrate or a silicon-on-insulator (SOI) substrate. Otherwise, the substrate may be a silicon substrate or may be a substrate formed of another material such as silicon germanium, indium antimonide, lead telluride, indium arsenide, indium phosphide, gallium arsenide, or gallium antimonide. In some embodiments the substrate is a semiconductor on insulator substrate, the semiconductor may be silicon or another material such as silicon germanium, indium antimonide, lead telluride, indium arsenide, indium phosphide, gallium arsenide, or gallium antimonide. In a method of fabricating a semiconductor device according to an embodiment of the present inventive concepts, a case where the substrate 200 is a silicon substrate will be described. Each of the regions may include a plurality of fins 206. The fins 206 may be formed by patterning a hard mask 208, such as a nitride mask, and then etching portions of the substrate 200 to reveal the fins 206. An insulator layer 210, such as oxide, may be formed for shallow trench isolation.

Figure 3A:
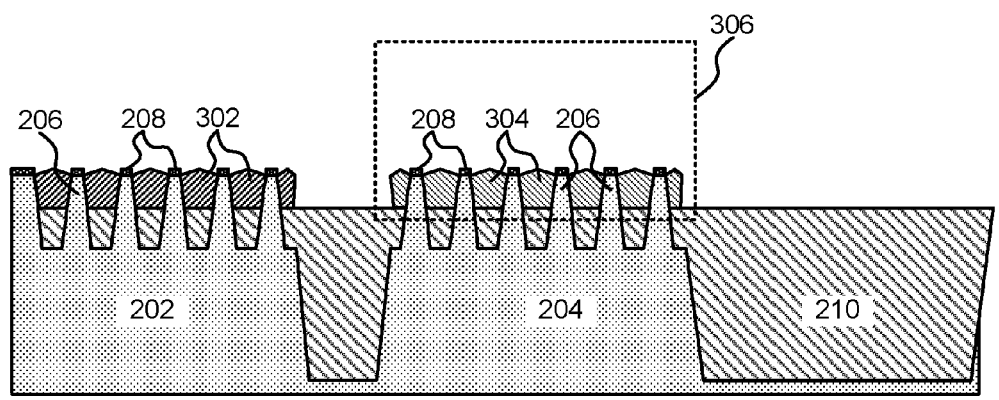
FIG. 3A is a cross-sectional view illustrating one embodiment of a semiconductor device at a processing flow step.

In FIG. 3A, sacrificial epitaxial layers 302, 304 may be formed on side of the fins 206. In an embodiment, the sacrificial epitaxial layers 302, 304 on sides of the fins 206, grow with the same lattice parameter as present in the fins 206 before this epitaxial growth step. Depending on the fin pitch and thickness of the sacrificial epitaxial layers 302, 304, the sacrificial epitaxial layers 302, 304 on adjacent fins 206 may merge or not. Preferably, the sacrificial epitaxial layers 302, 304 will merge.

In an embodiment a first sacrificial epitaxial layer 302 is formed in the nMOS region 202, and a second epitaxial layer 304 is formed in the pMOS region. The first epitaxial layer 302 may be formed of a material specifically suited for causing the type of strain desired for nMOS devices, and the second epitaxial layer 304 may be formed of a material specifically suited for causing the type of strain desired for pMOS devices. The types of strains include, tensile strain, compressive strain, and neutral strain. For example, materials having a larger lattice structure than the fin material may be suitable for nMOS devices, and materials having a smaller lattice structure than the fin material may be suitable for pMOS devices.

Figure 3B:
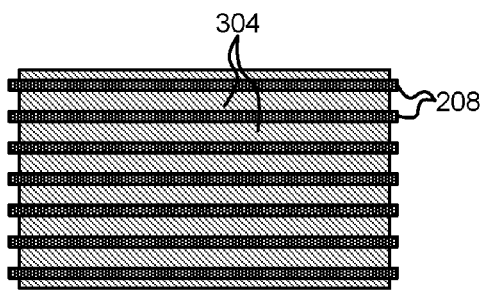
FIG. 3B is a top view illustrating a portion of the embodiment of a semiconductor device of FIG. 3A.

FIG. 3B is a top view illustrating a portion of the embodiment of a semiconductor device of FIG. 3A identified by box 306. In such an embodiment, alternating rows of fin material and sacrificial epitaxial material 304 are shown.

Figure 4A:
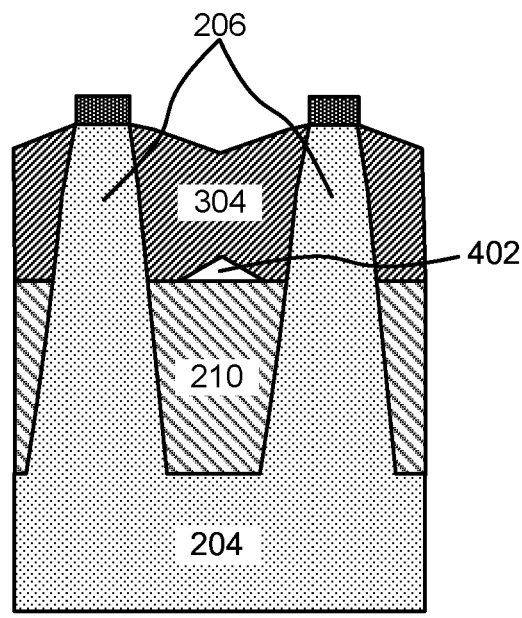
FIG. 4A is a cross-sectional view illustrating one embodiment of a semiconductor device at a processing flow step.
Figure 4B:
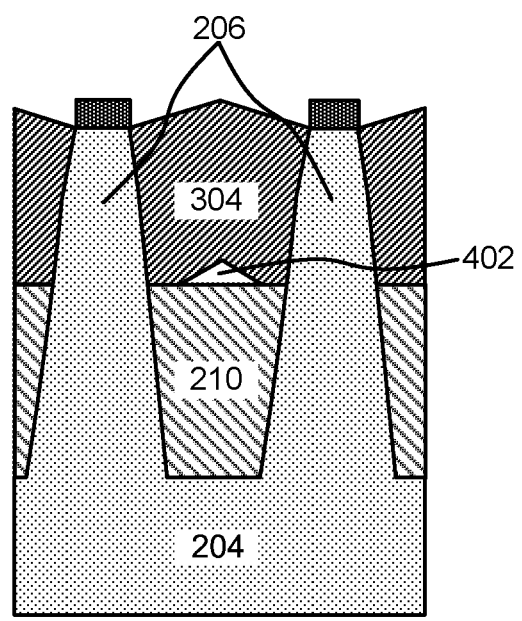
FIG. 4B is a cross-sectional view illustrating one embodiment of a semiconductor device at a processing flow step.

FIGS. 4A and 4B illustrate the cavity 402 which may be formed between the insulator layer 210 and the sacrificial epitaxial layer 304. In most embodiments, the sacrificial epitaxial layer 304 may grow with facets. For simplicity the schematics in FIG. 3A show the regions in between fins as fully filled with sacrificial epitaxial layer material. In practice, shapes may be different, and a cavity 402 may be left under the sacrificial epitaxial layer 304 when layers on adjacent fins 206 merge. Possible schematic illustrations of some of these cases are shown, but the exact shape will depend on the epitaxial process, crystal orientation, epitaxial growth thickness, and the like.

Figure 5:
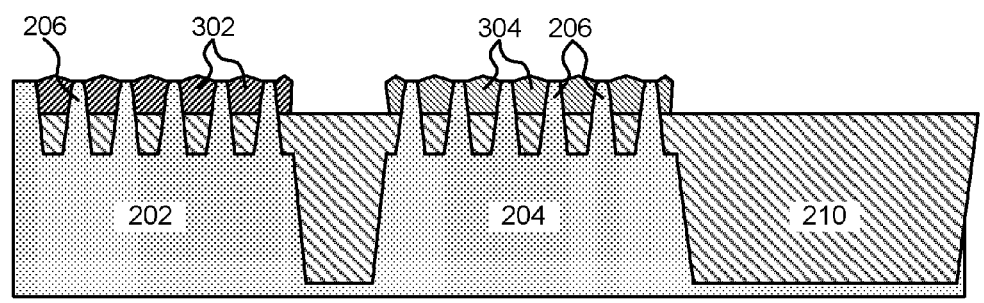
FIG. 5 is a cross-sectional view illustrating one embodiment of a semiconductor device at a processing flow step.

At the stage illustrated in FIG. 5, the hard mask layer 208 may be removed from the top of the fins 206. This step is useful for preparing to form the dummy gates. The hard mask layer 208 may be removed with various selective etch processes.

Figure 6:
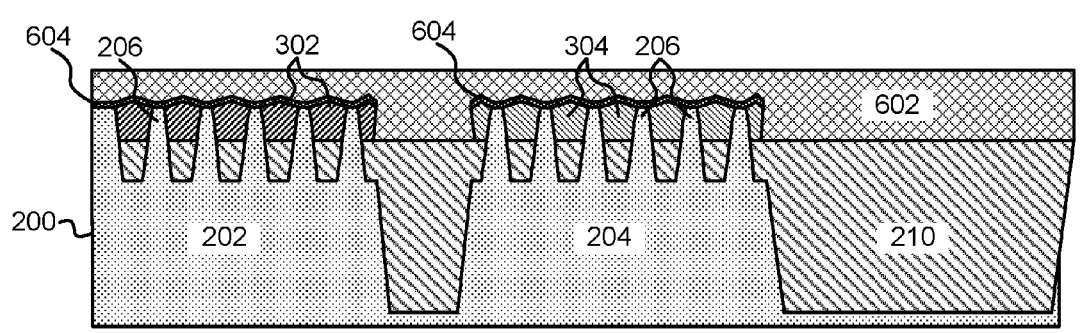
FIG. 6 is a cross-sectional view illustrating one embodiment of a semiconductor device at a processing flow step.
Figure 8A:
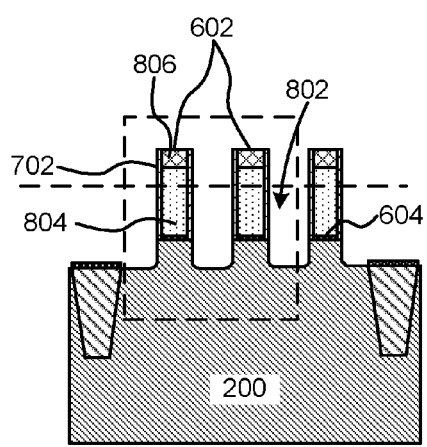
FIG. 8A is a cross-sectional view illustrating one embodiment of a semiconductor device at a processing flow step.

At the stage illustrated in FIG. 6, a dummy gate stack 602 may be formed in a region to be protected from an etch that forms the deep recess, which is illustrated in FIG. 8A. The dummy gate stack may include a dummy gate dielectric 604, such as a dummy gate oxide, and a dummy gate electrode 602, of materials such as polysilicon or amorphous-Si, or other suitable materials, and may include a capping layer such as a nitride which may be used as hard mask.

Figure 7:
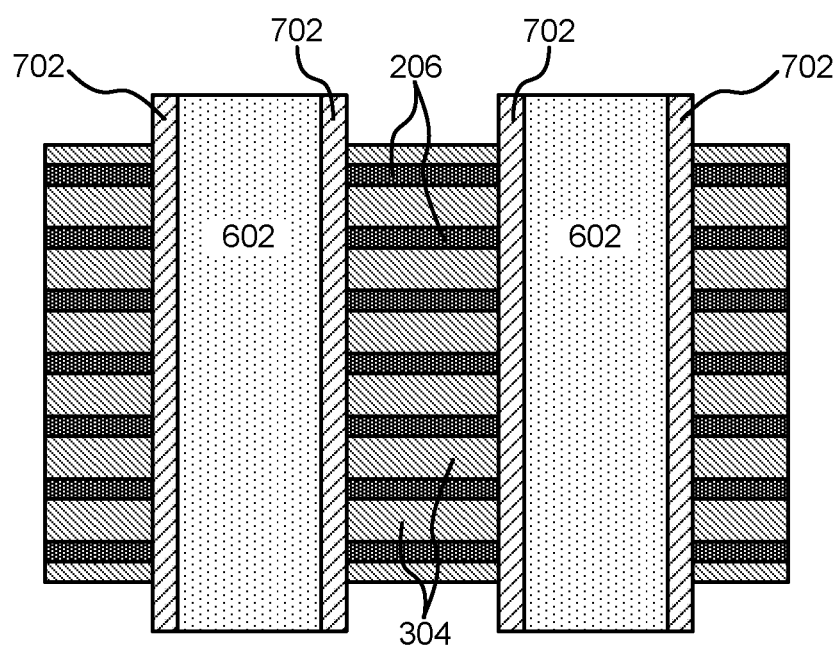
FIG. 7 is a top view illustrating a portion of the embodiment of a semiconductor device of FIG. 6.

FIG. 7 is a top view illustrating a portion of the embodiment of a semiconductor device of FIG. 6. In such an embodiment, a spacer 706 may be formed on the sides of the dummy gate 602 to protect the dummy gate during processing. The spacers 706 may be nitrides or oxy-nitrides. This top view shows the arrangement of the dummy gate electrode 602 and gate spacers 706 relative to the fin channels 702 and the sacrificial epitaxial layers 302, 304.

Figure 12A:
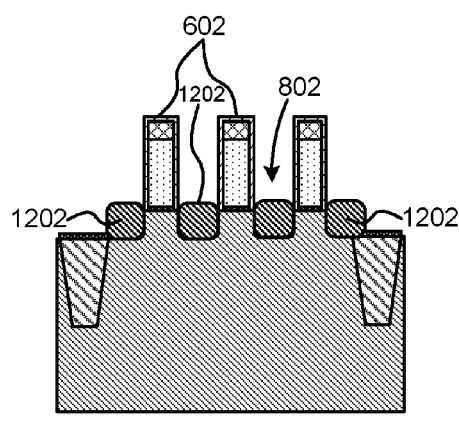
FIG. 12A is a cross-sectional view illustrating one embodiment of a semiconductor device at a processing flow step.

At the stage illustrated in FIG. 8A, the deep recesses 802 may be formed. The deep recesses 802 may be etched using various reactive etch chemistries that provide a suitable etch profile. The recesses may be etched down to different depths, but typically recess depths would not go beyond about the top to the STI regions. The deep recesses 802 may be formed to create a region for growing the SD material, as shown in FIG. 12A. In an embodiment, the dummy gate 602 may include a dummy gate oxide, a polysilicon or amorphous-Si layer 804 covered by a protective cap 806, such as a nitride layer or oxide layer.

Figure 8B:
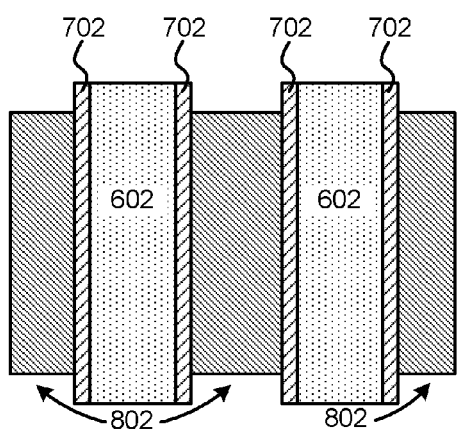
FIG. 8B is a top view illustrating a portion of the embodiment of a semiconductor device of FIG. 8A.

In an embodiment, the deep recess 802 may cut through the fin channels 206 and the sacrificial epitaxial layers 302, 304. When the deep recess 802 is formed, the fin channel 206 and the sacrificial epitaxial layers 302, 304 may relax elastically, thereby causing strain in the fin channels 206. Thus, the strain in the fin channels 206 is created before the SD material is deposited, and is relatively independent of the SD material, except that the SD material, when deposited, may hold the strain in the fin channels 206. FIG. 8B is a top view illustrating a portion of the embodiment of a semiconductor device of FIG. 8A. In an embodiment, the distance between adjacent SDs is kept to about 200 nm or less, to ensure elastic relaxation of the structure formed by the fin channel 206 and sacrificial epitaxial layers (302 or 304) materials in between deep recesses 802 after this step.

Figure 9:
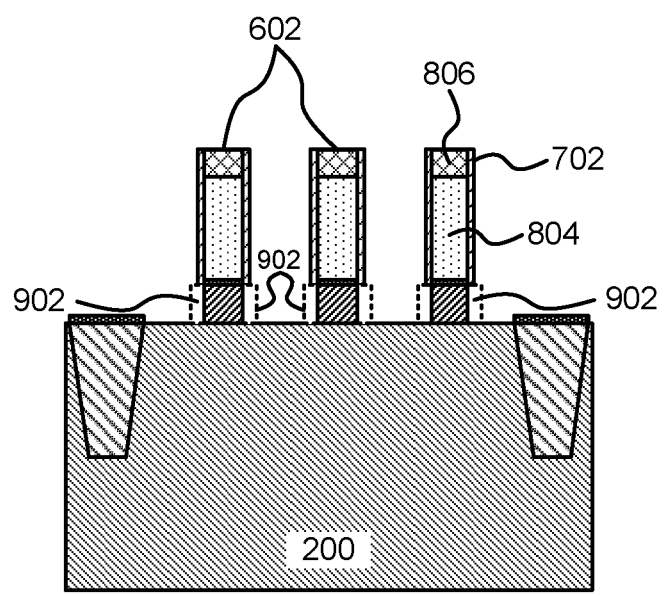
FIG. 9 is a cross-sectional view illustrating one embodiment of a semiconductor device at a processing flow step.
Figure 10A:
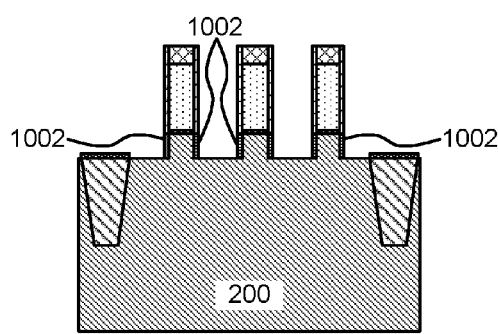
FIG. 10A is a cross-sectional view illustrating one embodiment of a semiconductor device at a processing flow step.
Figure 10B:
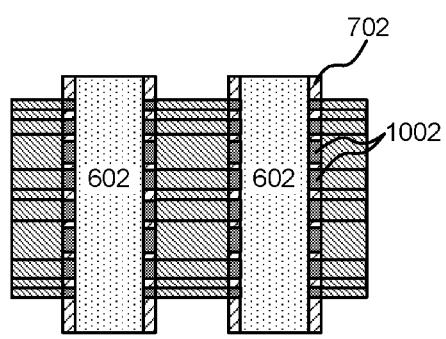
FIG. 10B is a top view illustrating a portion of the embodiment of a semiconductor device of FIG. 10A.

At the stage illustrated in FIG. 9, a portion of the sacrificial epitaxial layer 304 may be removed to form recesses 902 with respect to the fin channels 206. Some, but not all of the sacrificial epitaxial layer 304 may be removed. In some embodiments, at least 5 nm of sacrificial material is left after this step, as measured in the direction parallel to the Fin. In an embodiment, an internal spacer 1002 may be formed, as shown in FIG. 10. The thickness of the internal spacer 1002, as well as the material chosen for the internal spacer 1002 may modify the strain created on the fin channels 206. In some embodiments the recesses 902 may be between 2 nm and 8 nm deep. The thickness of the spacer 1002 may or may not match the depth of the recess 902. For example, an etch back process may etch back the internal spacer 1002 to a thickness that is less than the depth of the recess 902. In an embodiment, deeper recesses 902 in this step will result in more strain loss in the fin channel 206. An optimization of parasitic parameters associated with the strain (strain-$RC_{para}$) may be used to choose the optimal recess in this step for best device performance. FIG. 10B is a top view illustrating a portion of the embodiment of a semiconductor device of FIG. 10A.

Figure 11A:
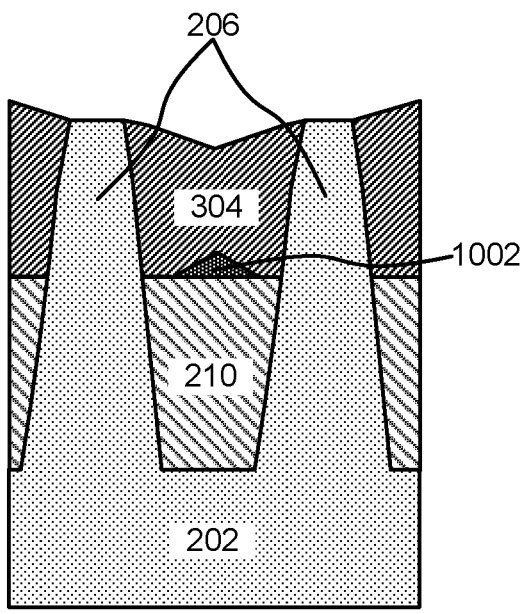
FIG. 11A is a cross-sectional view illustrating one embodiment of a semiconductor device at a processing flow step.
Figure 11B:
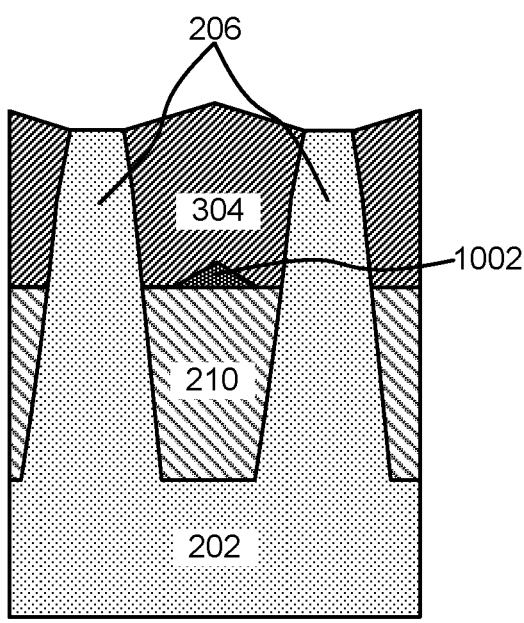
FIG. 11B is a cross-sectional view illustrating one embodiment of a semiconductor device at a processing flow step.

In embodiments in which a cavity 402 is left under the sacrificial epitaxial layer 302, 304 as shown in FIGS. 4A-4B, the cavity 402 may be filled during internal spacer deposition, or at least conditions may be adjusted to ensure filling of the cavity 402 with internal spacer material 1002 during internal spacer deposition as shown at FIGS. 11A and 11B. In some embodiments, the cavity may be completely filled by spacer material; in other embodiments, the cavity may be partially filled by spacer material, the spacer material isolating or separating the remainder of the cavity from the SD regions. In such embodiments, an internal spacer material that can be etched selectively to the external spacer material 702 may be chosen to allow easier removal of residual internal material. An example is to use Si—O—C as internal spacer material may be used.

Figure 12B:
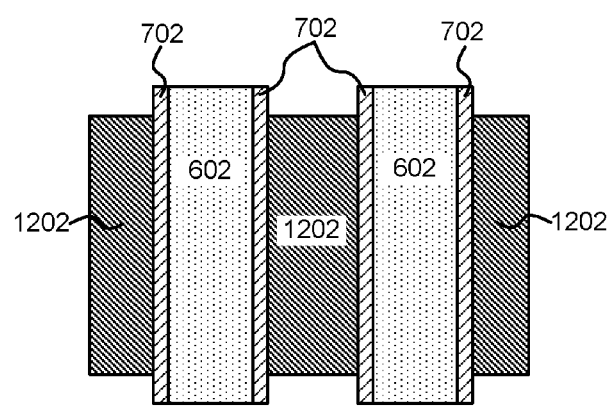
FIG. 12B is a top view illustrating a portion of the embodiment of a semiconductor device of FIG. 12A.

At the step shown in FIGS. 12A and 12B, the SD material 1202 may be deposited in the deep recesses 802. In some embodiments, the SD material 1202 is grown or deposited in a way that does not change substantially the strain state in the fin channel 206, as compared with the strain state before SD growth or deposition. In some embodiments, an epitaxial material may be used that has a different lattice parameter than the material removed in the deep SD recess, so that an additional strain, of same type that is present in the channel immediately after performing the deep SD recess, may be obtained. In some embodiments the SD regrowth is done by growth of an epitaxial layer. In some embodiments, this epitaxial layer may have defects. In some embodiments, the SD refill is deposited in this step and does not grow epitaxially. In typical embodiments, the SD regrowth or refill results in a SD that is substantially of the same height or taller than the material removed at the SD recess step. In such an embodiment, the top of the SD material 1202 after this step is about leveled or taller than the fin channel 206.

Figure 13A:
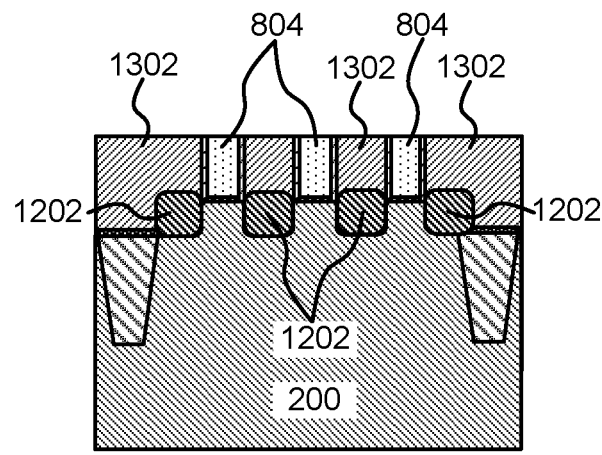
FIG. 13A is a cross-sectional view illustrating one embodiment of a semiconductor device at a processing flow step.
Figure 13B:
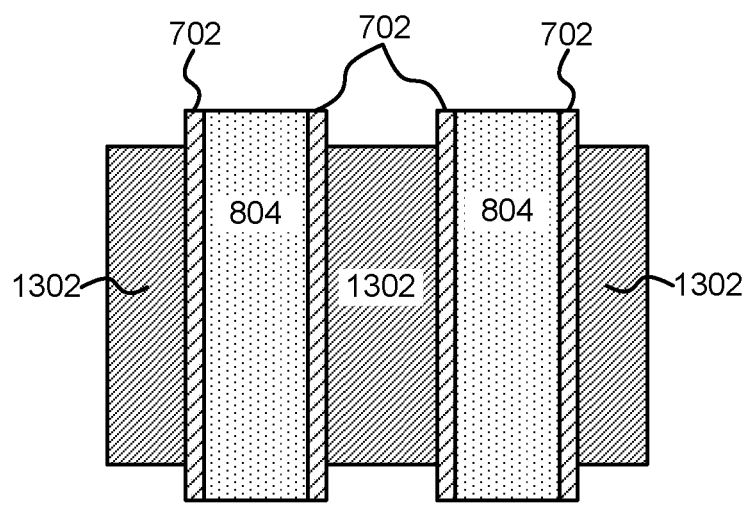
FIG. 13B is a top view illustrating a portion of the embodiment of a semiconductor device of FIG. 13A.

In the steps shown in FIGS. 13A-17A, a dielectric (1302) such as an oxide is formed on top of the structure and planarized, the dummy gate 602 is removed and a replacement metal gate is formed. FIG. 13A is a cross-sectional view illustrating the structure after formation of the dielectric (1302) and planarization including removal of the protective cap 806 from the dummy gate 602. FIG. 13B is a top view showing the polysilicon or amorphous-Si layer 804 exposed.

Figure 14A:
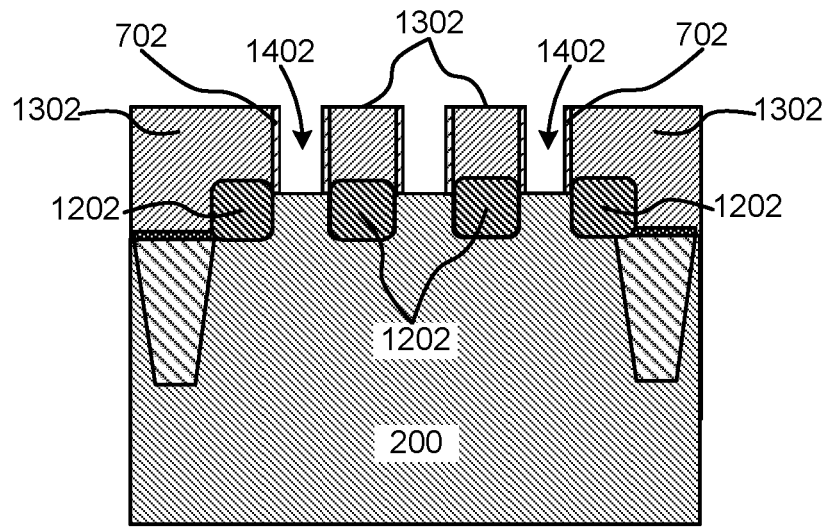
FIG. 14A is a cross-sectional view illustrating one embodiment of a semiconductor device at a processing flow step.
Figure 14B:
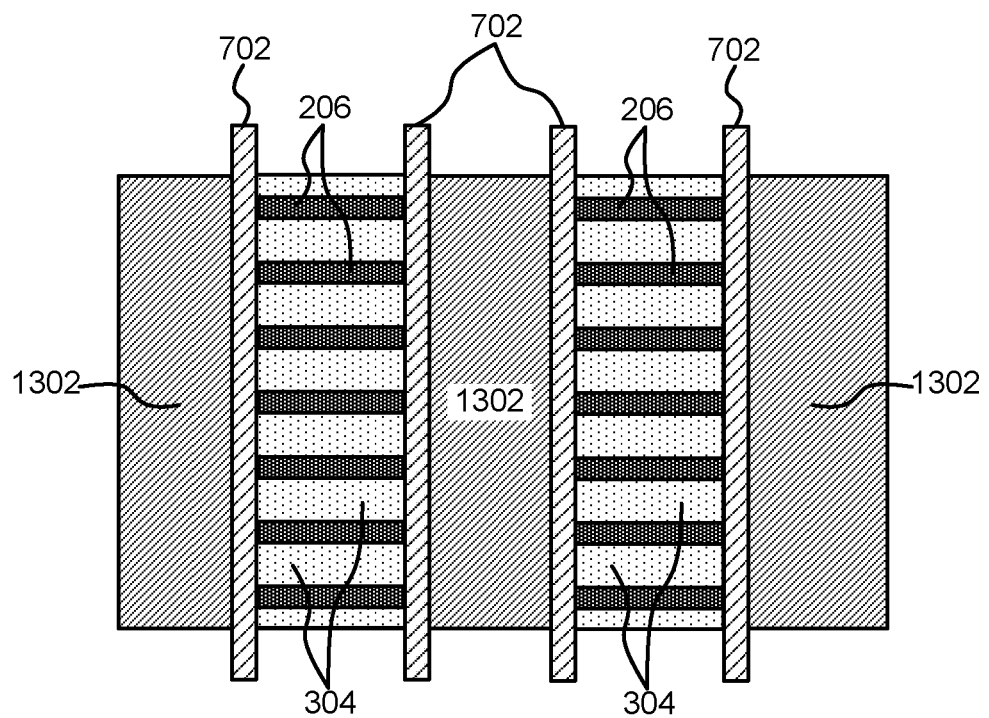
FIG. 14B is a top view illustrating a portion of the embodiment of a semiconductor device of FIG. 14A.

At the step shown in FIGS. 14A and 14B, the polysilicon or amorphous-Si layer 804 and the dummy gate oxide layer are removed. These layers may be removed by various selective etch processes. In FIG. 14B, it can be seen that the fin channels 206 and the sacrificial epitaxial layer 304 are exposed in the region where the dummy gate 602 was removed. Thus, the replacement metal gate may be formed directly over the fin channels 206.

Figure 15A:
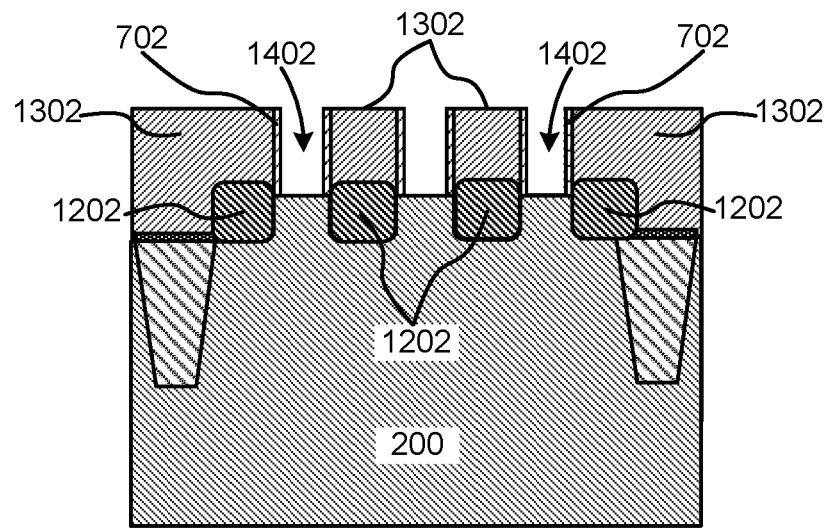
FIG. 15A is a cross-sectional view illustrating one embodiment of a semiconductor device at a processing flow step.
Figure 15B:
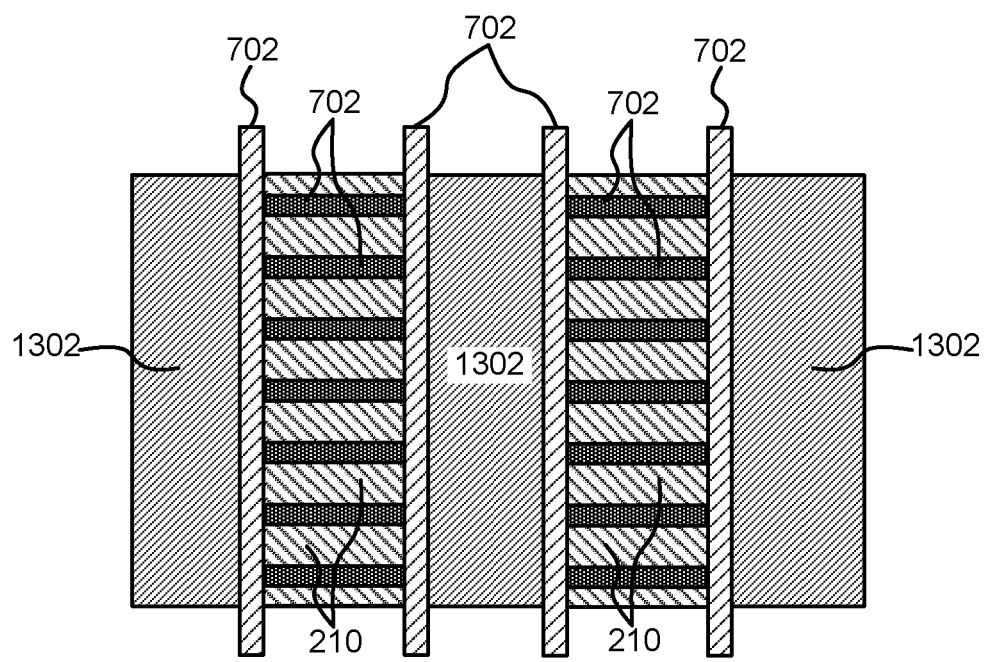
FIG. 15B is a top view illustrating a portion of the embodiment of a semiconductor device of FIG. 15A.

In the step illustrated in FIGS. 15A and 15B, the sacrificial epitaxial layer 302, 304 between the fin channels 206 may be removed selectively to the fin material so that the fin remains. The strain profile in the channel changes in this step mainly by going from a non-uniform strain profile before sacrificial layer etch, into a more uniform strain profile after sacrificial layer etch. Average strain in the channel is partially preserved by the SDs 1202, which act as pinning structures. A portion of the strain in the fin channels 206 may be lost due to some elastic deformation of the SD regions 1202. In some embodiments, loss of average strain in the channel during sacrificial layer etch is less than fifty percent. In some embodiments, loss of average strain in the channel during sacrificial layer etch is less than thirty percent.

In some embodiments, part or the entire amount of residual internal spacer 1002 material located in the replacement metal gate cavity below the sacrificial epitaxial layer 302, 304 may be removed after removal of the sacrificial epitaxial layer 302, 304. An anisotropic etch would be used in this case to remove the residual internal spacer 1002 material in order to prevent excessive removal of the internal spacers themselves.

Figure 16A:
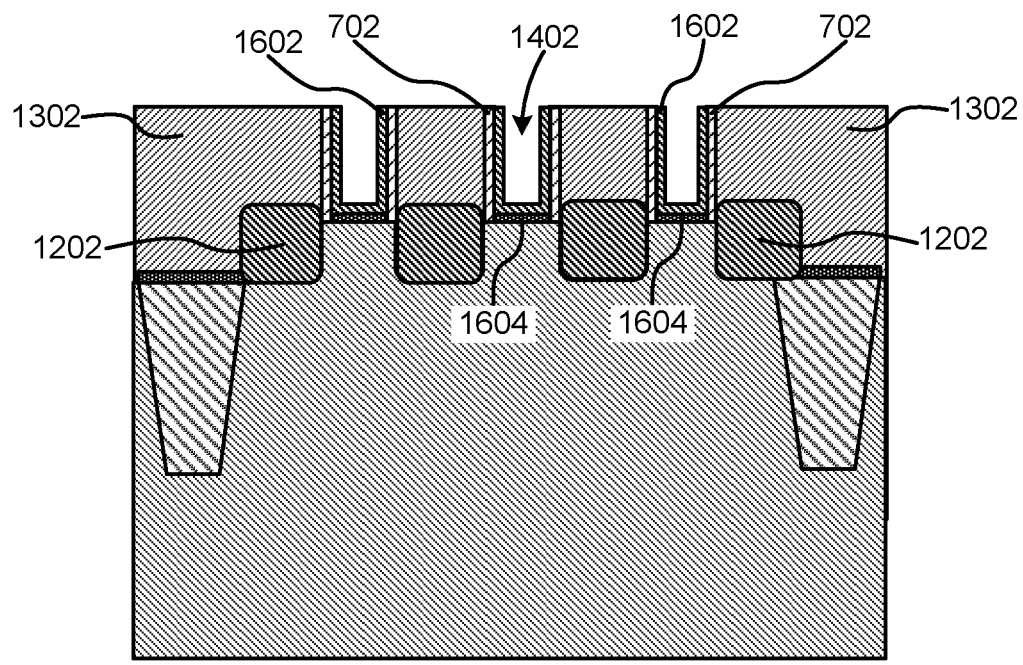
FIG. 16A is a cross-sectional view illustrating one embodiment of a semiconductor device at a processing flow step.
Figure 16B:
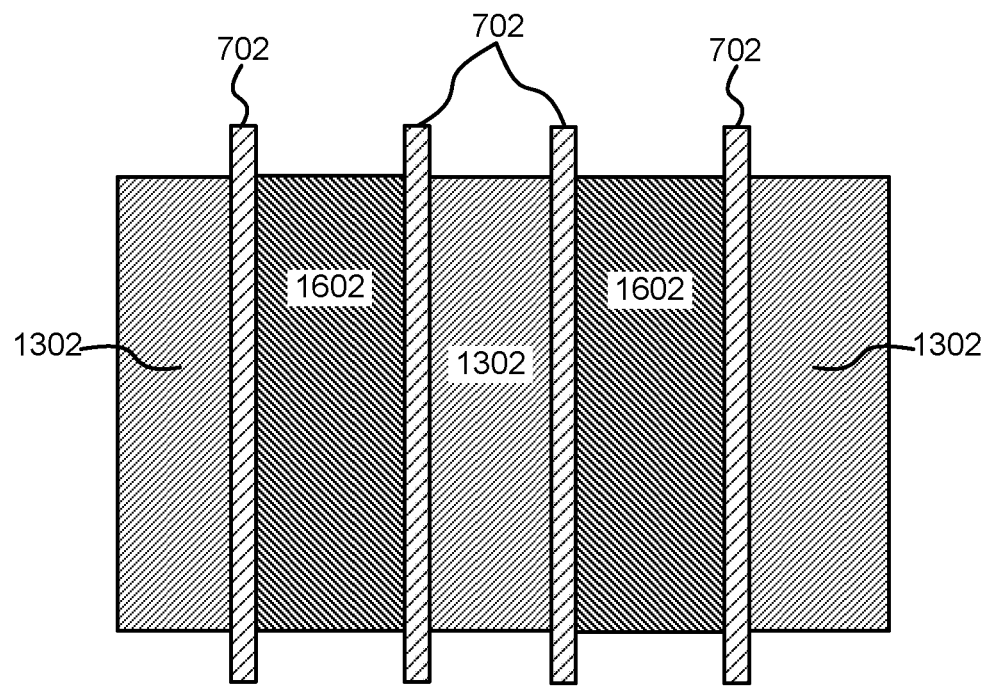
FIG. 16B is a top view illustrating a portion of the embodiment of a semiconductor device of FIG. 16A.

In FIGS. 16A and 16B an oxide layer 1604 may be formed over the surface of the fin channels between the spacers 702 and a high-k layer 1602 may be formed thereon. If there is residual internal spacer material that had been left under the sacrificial epitaxial layers 302, 304 before their removal, the gate stack deposited during the replacement metal gate formation will also wrap around this residual internal spacer material in between fins.

Figure 17A:
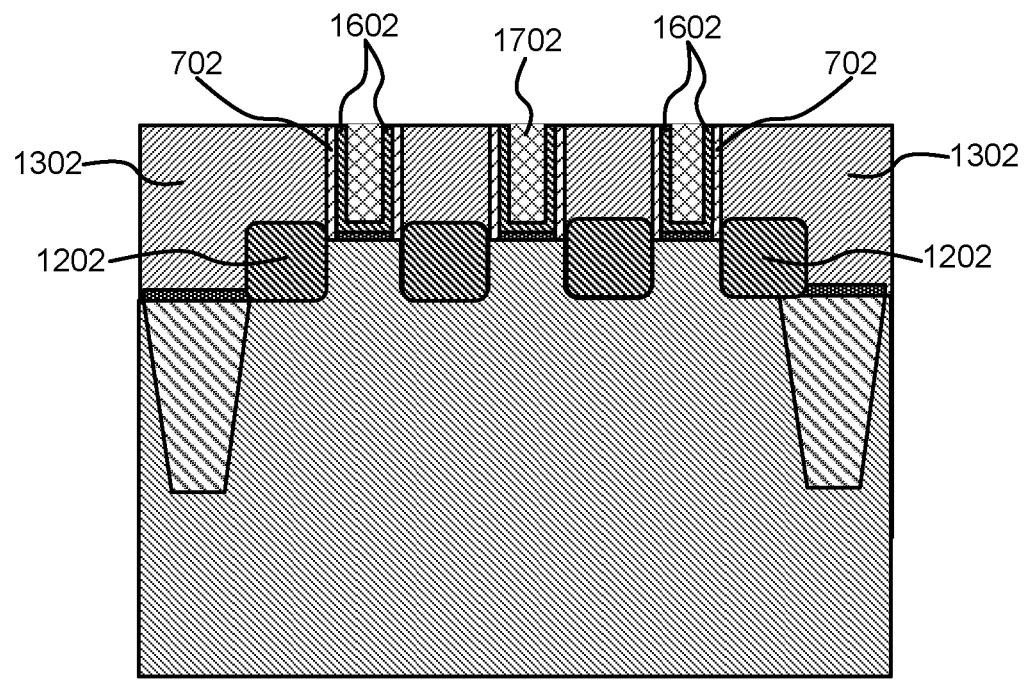
FIG. 17A is a cross-sectional view illustrating one embodiment of a semiconductor device at a processing flow step.
Figure 17B:
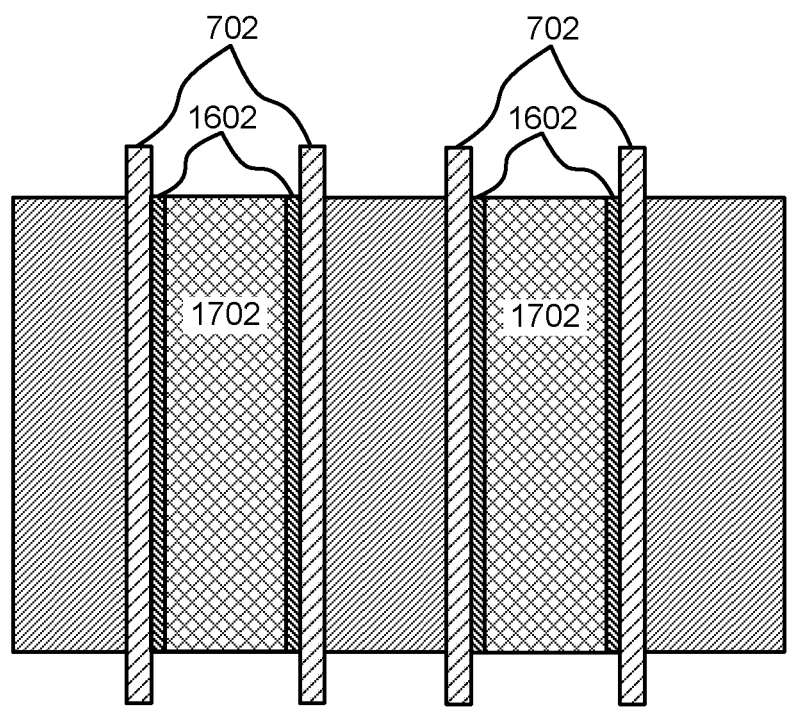
FIG. 17B is a top view illustrating a portion of the embodiment of a semiconductor device of FIG. 17A.

At the step shown in FIGS. 17A and 17B, a metal gate layer 1702 is formed in the recess over the high-k layer 1602. The metal may be deposited by various deposition techniques, including physical vapor deposition (PVD), chemical vapor deposition (CVD), atomic layer deposition (ALD) or the like. Further processing and packaging of the device, including formation of vias and contacts may be performed according to known processes.

Figure 18:
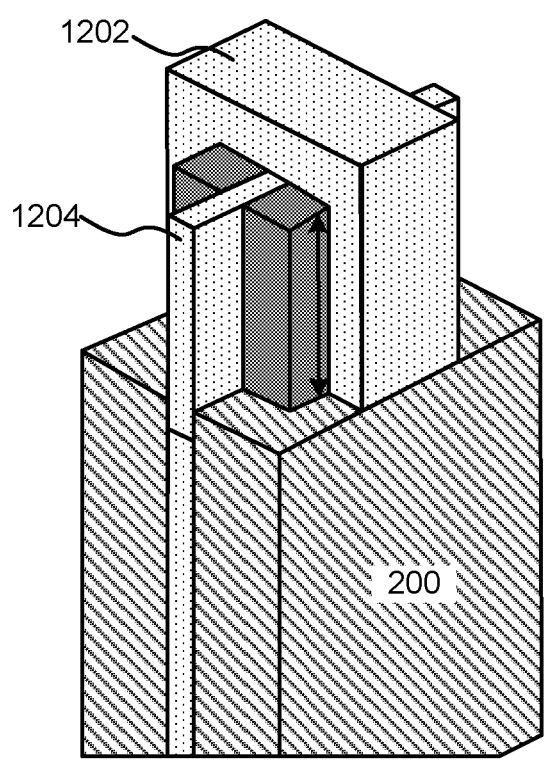
FIG. 18 is a model of one embodiment of a semiconductor device manufactured according to the methods described in FIGS. 1-17B.
Figure 19:
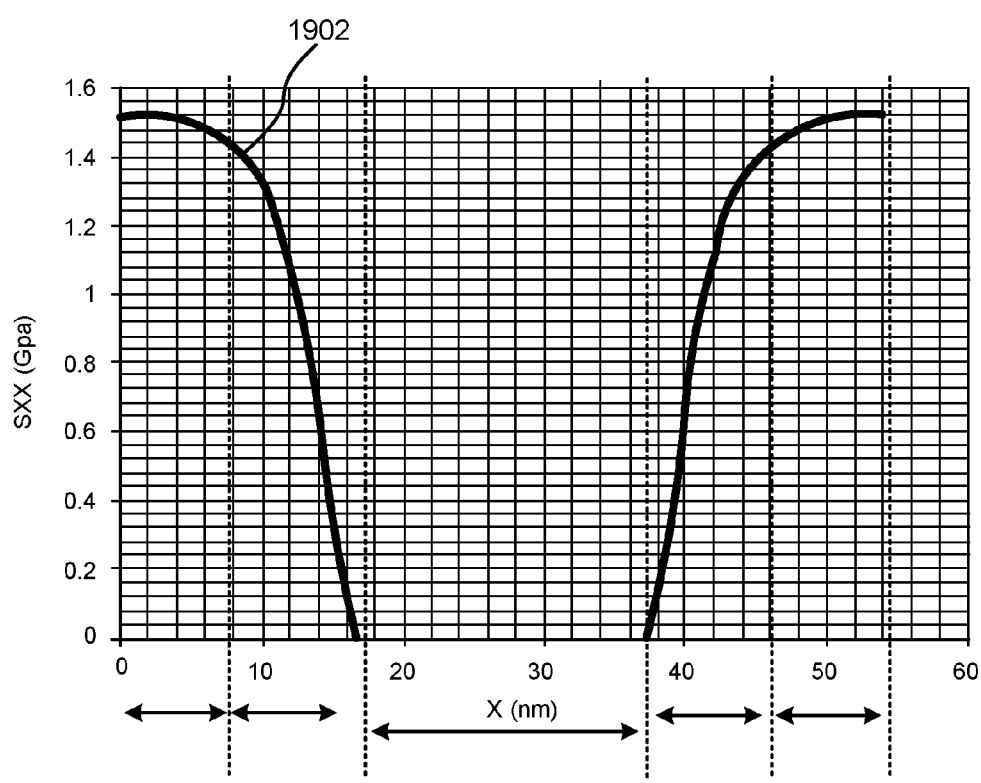
FIG. 19 is a graphical representation of a physical parameter of a component of a semiconductor device manufactured according to the methods described in FIGS. 1-17B.
Figure 20:
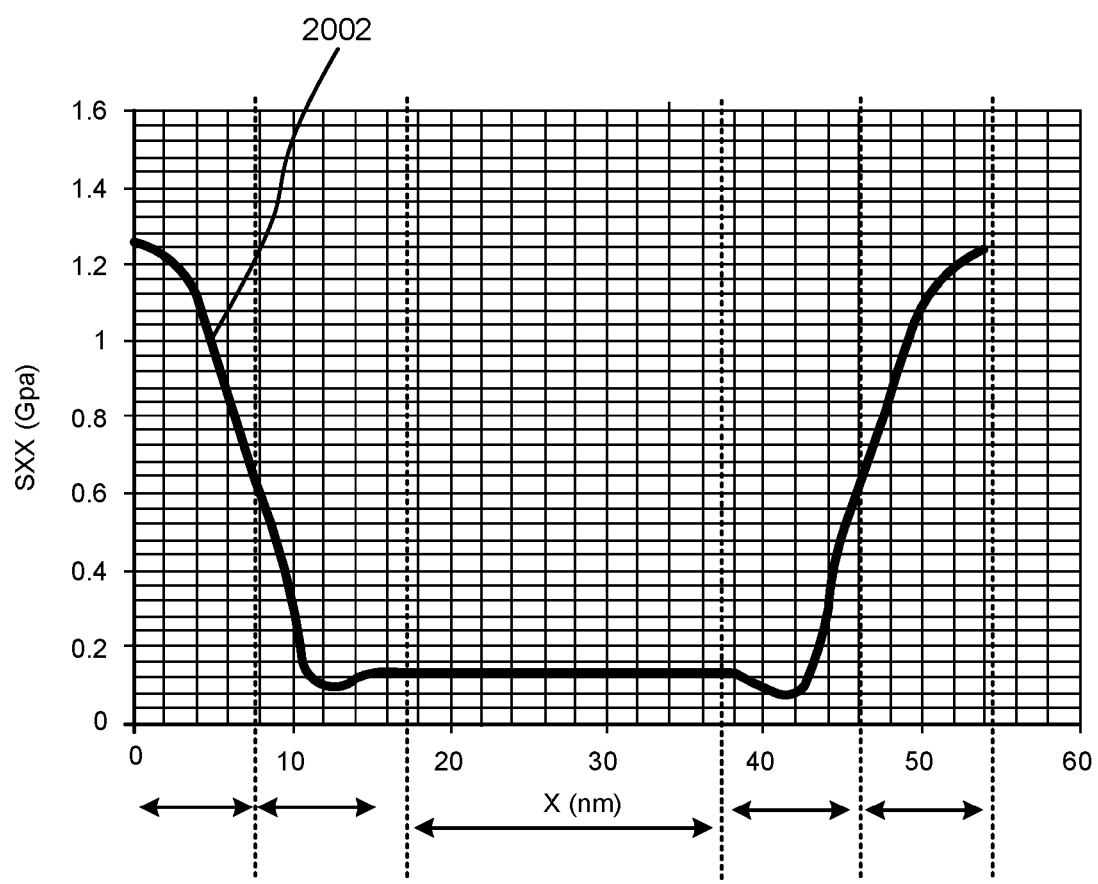
FIG. 20 is a graphical representation of a physical parameter of a component of a semiconductor device manufactured according to the methods described in FIGS. 1-17B.
Figure 21:
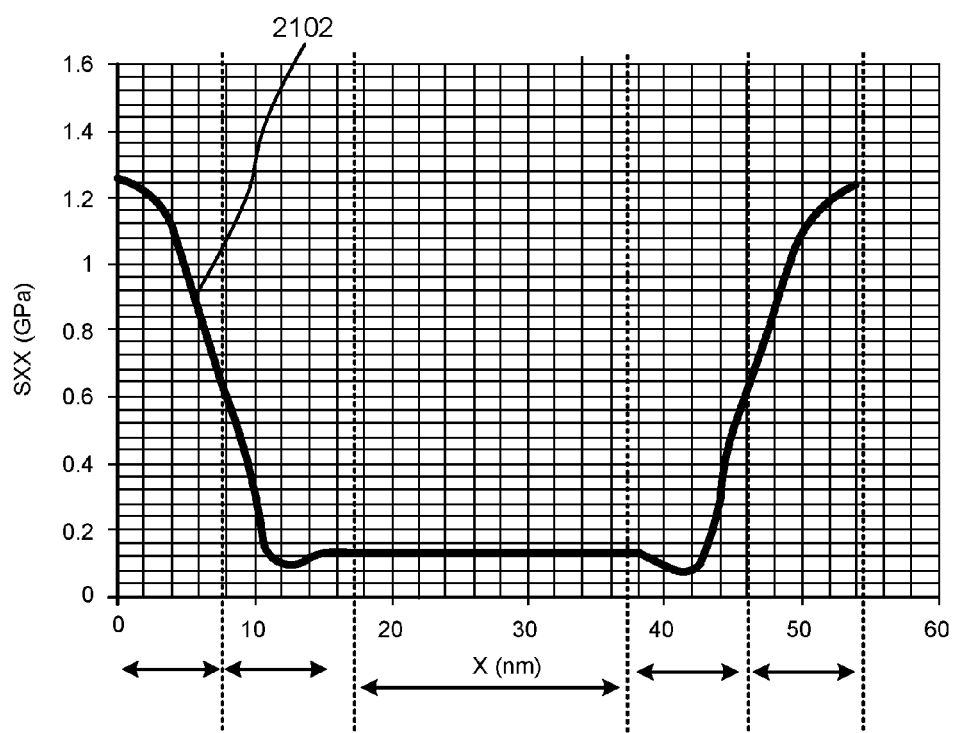
FIG. 21 is a graphical representation of a physical parameter of a component of a semiconductor device manufactured according to the methods described in FIGS. 1-17B.
Figure 22:
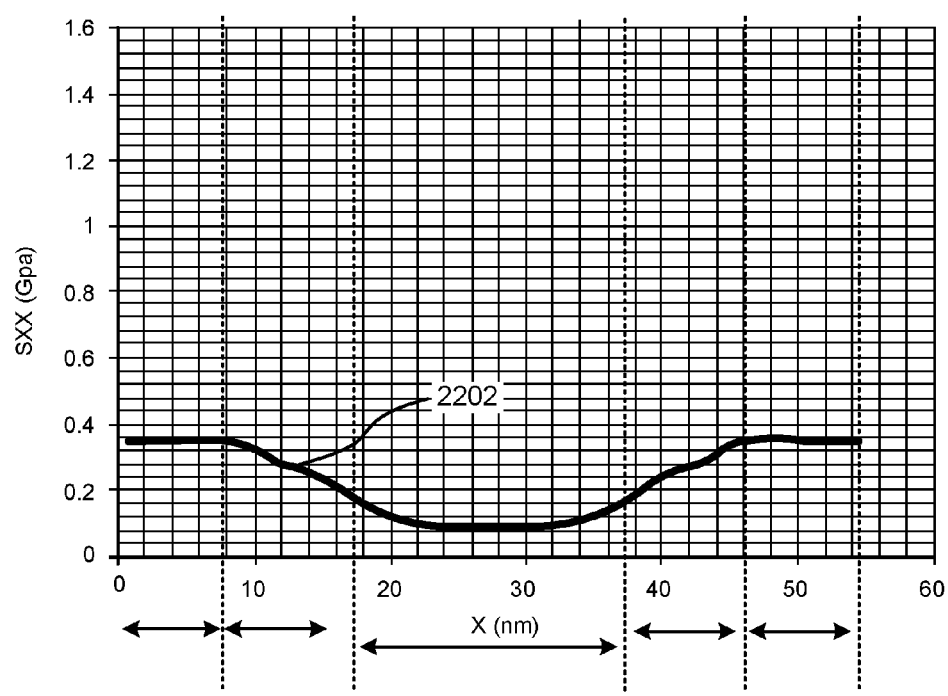
FIG. 22 is a graphical representation of a physical parameter of a component of a semiconductor device manufactured according to the methods described in FIGS. 1-17B.

FIG. 18 is a model of one embodiment of a semiconductor device manufactured according to the methods described in FIGS. 1-17B. The graphs shown in FIGS. 19-22 show simulation results that illustrate the strain on the fin channel at various stages of the manufacturing process. FIG. 19 illustrates the strain at various locations on the model after the deep recesses 802 are formed at FIGS. 8A and 8B. FIG. 20 illustrates the strain after deposition of the internal spacers 1002 at FIGS. 10A and 10B. FIG. 21 illustrates the strain after regrowth of the SD material 1202 as shown at FIGS. 12A and 12B. FIG. 22 illustrates the strain after removal of the sacrificial epitaxial layers 302, 304 as shown at FIGS. 15A and 15B.

Figure 23:
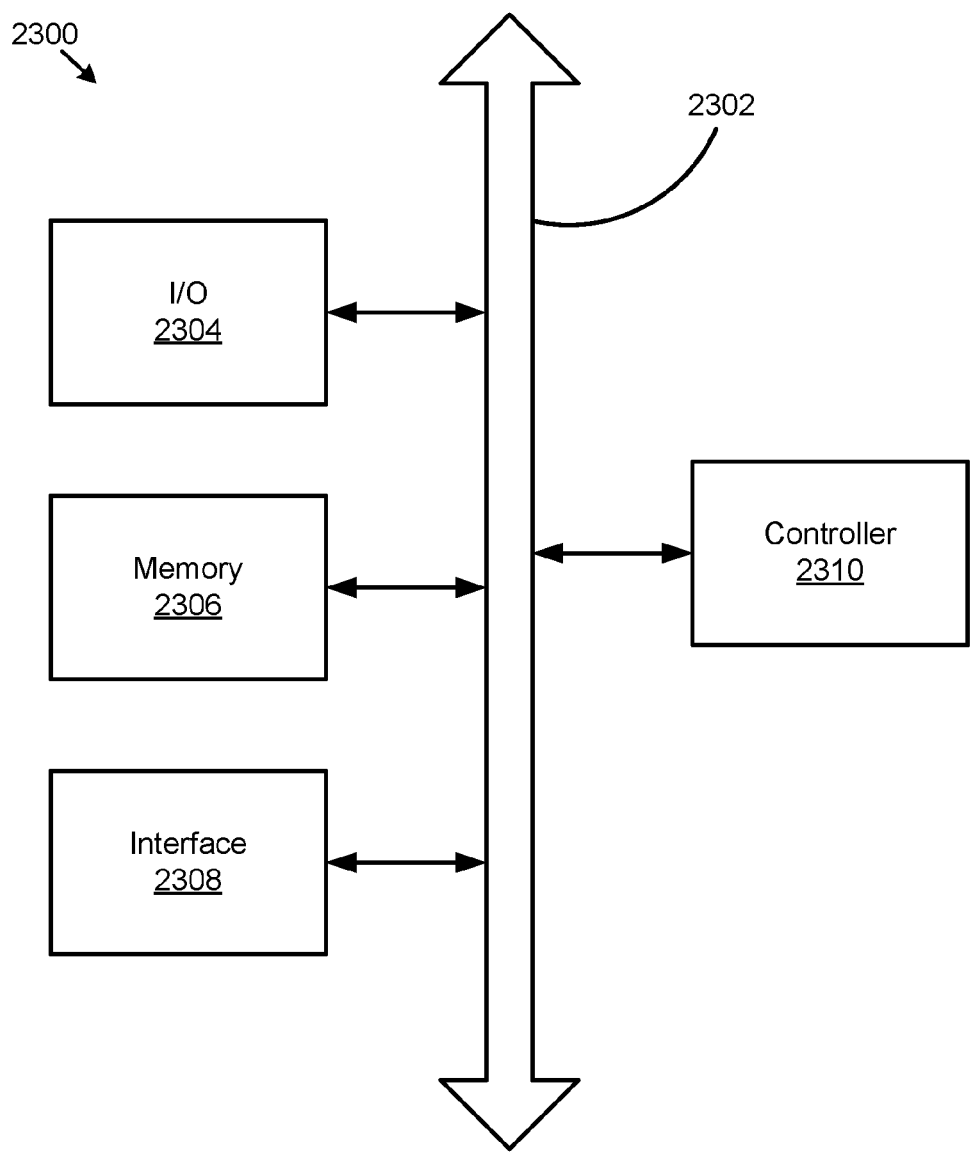
FIG. 23 is a schematic block diagram illustrating an electronic system including semiconductor devices according to the present embodiments.

FIG. 23 is a block diagram of an electronic system 2300 including semiconductor devices according to embodiments of the present embodiments. Referring to FIG. 23, the electronic system 2300 may include a controller 2310, an input/output (I/O) device 2304, a memory device 2306, an interface 2308 and a bus 2302. The controller 2310, the I/O device 2304, the memory device 2306 and/or the interface 2308 may be connected to one another by the bus 2302. The bus 2302 may serve as a path for transmitting data.

The controller 2310 may include at least one of a microprocessor, a digital signal processor, a microcontroller and logic devices capable of performing similar functions to those of a microprocessor, a digital signal processor and a microcontroller. The I/O device 2304 may include a keypad, a keyboard and a display device. The memory device 2306 may store data and/or commands. The interface 2308 may be used to transmit data to or receive data from a communication network. The interface 2308 may be a wired or wireless interface. In an example, the interface 2308 may include an antenna or a wired or wireless transceiver.

Although not illustrated in the drawing, the electronic system 2300 may be an operating memory for improving the operation of the controller 2310, and may also include a high-speed DRAM or SRAM. Here, any one of the semiconductor devices according to the above-described embodiments of the present inventive concepts may be employed as the operating memory. In addition, any one of the semiconductor devices according to the above-described embodiments may be provided in the memory device 2306, in the interface 2308, in the controller 2310 or in the I/O device 2304.

The electronic system 2300 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for processing a field effect transistor (FET) device, comprising:

forming a first fin structure and a second fin structure, each of the first and second fin structures comprising a fin channel on a substrate;

forming a dummy gate on the first and second fin structures;

forming an insulator layer between the first fin structure and the second fin structure;

forming a first sacrificial epitaxial layer on a side of the first fin structure and a second sacrificial epitaxial layer on a side of the second fin structure, wherein the first sacrificial epitaxial layer and the second sacrificial epitaxial layer are in direct contact with each other over a top surface of the insulator layer so that a cavity is defined by the first sacrificial epitaxial layer, the second sacrificial epitaxial layer and the top surface of the insulator layer;

forming a deep recess in a region that includes at least a portion of the first fin structure, wherein the first fin structure and the first sacrificial epitaxial layer relax elastically to form a strain on the fin channel of the first fin structure, wherein the dummy gate is formed in a region to be protected from an etch that forms the deep recess;

removing a portion of the first sacrificial epitaxial layer from the side of the first fin structure, selective to the fin channel of the first fin structure, after forming the deep recess and before removal of the dummy gate, to form a recess with respect to the fin channel of the first fin structure;

forming a spacer in the recess; and depositing source/drain (SD) material in the deep recess to preserve the strain on the fin channel of the first fin structure.

2. The method of claim 1, further comprising removing the dummy gate after depositing the SD material in the deep recess.

3. The method of claim 2, further comprising removing the first sacrificial epitaxial layer from the cavity left by the dummy gate, wherein removing the first sacrificial epitaxial layer is performed selectively to a material of the first fin structure.

4. The method of claim 3, further comprising forming a replacement metal gate (RMG) in the region from which the dummy gate and sacrificial layer were removed.

5. The method of claim 1,
wherein the spacer is configured to modify the strain on the fin channel.

6. The method of claim 1,
wherein the SD material is epitaxial with respect to the first fin structure.

7. The method of claim 1,
wherein the first sacrificial epitaxial layer comprises a material that has a larger lattice parameter than a fin material of the first fin structure to induce tensile strain on the fin channel.

8. The method of claim 1,
wherein the first sacrificial epitaxial layer comprises a material that has a smaller lattice parameter than a fin material of the first fin structure to induce compressive strain on the fin channel.

9. The method of claim 1, wherein the spacer is formed of nitride or oxynitride.

10. A field effect transistor (FET) device, comprising:
substrate;
a fin structure comprising a fin channel disposed on the substrate;
a sacrificial epitaxial layer disposed on a side of the fin structure;
a deep recess (802) in a region that includes at least a portion of the fin structure, wherein the fin structure and sacrificial layer relax elastically to form a strain on the fin channel;
a recess in the sacrificial epitaxial layer, with respect to the fin channel, formed by removing a portion of the sacrificial epitaxial layer from the side of the fin structure, selective to the fin channel, wherein the recess exposes the side of the fin structure;
a spacer formed in the recess, wherein the spacer is formed of nitride or oxynitride; and
a source/drain (SD) layer deposited in the deep recess to preserve the strain on the fin channel.

11. The FET device of claim 10, further comprising a replacement metal gate (RMG) in the region from which a dummy gate has been removed during processing of the FET device.

12. The FET device of claim 10,
wherein the spacer is configured to modify the strain on the fin channel.

13. The FET device of claim 10,
wherein the SD layer is epitaxial with respect to the fin structure.

14. The FET device of claim 10,
wherein the sacrificial epitaxial layer formed on the side of the fin structure merges with a sacrificial epitaxial layer formed on a side of an adjacent fin structure.

15. The FET device of claim 10,
wherein the sacrificial epitaxial layer comprises a material that has a larger lattice parameter than a material of the fin channel to induce tensile strain on the fin channel.

16. The FET device of claim 10,
wherein the sacrificial epitaxial layer comprises a material that has a smaller lattice parameter than a material of the fin channel to induce compressive strain on the fin channel.

17. The FET device of claim 10, further comprising an n-channel metal-oxide-silicon (nMOS) FET device.

18. The FET device of claim 10, further comprising a p-channel metal-oxide-silicon (pMOS) FET device.

19. The FET device of claim 10,
wherein the spacer is in direct contact with the exposed side of the fin structure.

* * * * *